United States Patent
Le et al.

(10) Patent No.: US 10,249,742 B2
(45) Date of Patent: Apr. 2, 2019

(54) OFFSTATE PARASITIC LEAKAGE REDUCTION FOR TUNNELING FIELD EFFECT TRANSISTORS

(71) Applicant: Intel Corporation, Santa Clara, CA (US)

(72) Inventors: Van H. Le, Portland, OR (US); Gilbert Dewey, Hillsboro, OR (US); Benjamin Chu-Kung, Portland, OR (US); Ashish Agrawal, Hillsboro, OR (US); Matthew V. Metz, Portland, OR (US); Willy Rachmady, Beaverton, OR (US); Marc C. French, Forest Grove, OR (US); Jack T. Kavalieros, Portland, OR (US); Rafael Rios, Austin, TX (US); Seiyon Kim, Portland, OR (US); Seung Hoon Sung, Portland, OR (US); Sanaz K. Gardner, Portland, OR (US); James M. Powers, Beaverton, OR (US); Sherry R. Taft, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/576,468

(22) PCT Filed: Jun. 27, 2015

(86) PCT No.: PCT/US2015/038192
§ 371 (c)(1),
(2) Date: Nov. 22, 2017

(87) PCT Pub. No.: WO2017/003409
PCT Pub. Date: Jan. 5, 2017

(65) Prior Publication Data
US 2018/0158933 A1    Jun. 7, 2018

(51) Int. Cl.
H01L 29/66    (2006.01)
H01L 29/78    (2006.01)
(Continued)

(52) U.S. Cl.
CPC .... H01L 29/66977 (2013.01); H01L 29/1054 (2013.01); H01L 29/66742 (2013.01);
(Continued)

(58) Field of Classification Search
None
See application file for complete search history.

(56) References Cited

U.S. PATENT DOCUMENTS

| 2014/0008733 A1 | 1/2014 | Shrivastava et al. |
| 2014/0252478 A1 | 9/2014 | Doornbos et al. |

(Continued)

FOREIGN PATENT DOCUMENTS

| KR | 10-2006-0068038 | 6/2006 |
| KR | 10-2015-0035452 | 4/2015 |

OTHER PUBLICATIONS

International Preliminary Report on Patentability for International Patent Application No. PCT/US2015/038192, dated Jan. 11, 2018, 12 pages.

(Continued)

*Primary Examiner* — Dung A. Le
(74) *Attorney, Agent, or Firm* — Schwabe, Williamson & Wyatt, P.C.

(57) ABSTRACT

A method including forming a non-planar conducting channel of a device between junction regions on a substrate, the substrate including a blocking material beneath the channel, the blocking material including a property to inhibit carrier leakage; and forming a gate stack on the channel, the gate stack including a dielectric material and a gate electrode. A method including forming a buffer material on a semicon- (Continued)

ductor substrate, the buffer material including a semiconductor material including a different lattice structure than the substrate; forming a blocking material on the buffer material, the blocking material including a property to inhibit carrier leakage; and forming a transistor device on the substrate. An apparatus including a non-planar multi-gate device on a substrate including a transistor device including a channel disposed on a substrate including a blocking material beneath the channel, the blocking material including a property to inhibit carrier leakage.

22 Claims, 7 Drawing Sheets

(51) Int. Cl.
  *H01L 29/786* (2006.01)
  *H01L 29/10* (2006.01)
(52) U.S. Cl.
  CPC ........ *H01L 29/66795* (2013.01); *H01L 29/78* (2013.01); *H01L 29/785* (2013.01); *H01L 29/78609* (2013.01); *H01L 29/78684* (2013.01); *H01L 29/78696* (2013.01)

(56) References Cited

U.S. PATENT DOCUMENTS

| | | | |
|---|---|---|---|
| 2014/0264592 A1* | 9/2014 | Oxland | H01L 29/785 257/347 |
| 2015/0162436 A1 | 6/2015 | Toh et al. | |
| 2015/0179644 A1 | 6/2015 | Akarvardar et al. | |
| 2015/0179800 A1 | 6/2015 | Biswas et al. | |
| 2015/0200286 A1* | 7/2015 | Liu | H01L 29/66462 257/194 |
| 2017/0194142 A1* | 7/2017 | Goel | H01L 21/02549 |

OTHER PUBLICATIONS

International Search Report and Written Opinion for International Patent Application No. PCT/US2015/038192 dated Mar. 28, 2016, 15 pgs.

Search Report from European Patent Application No. 15897300.8, dated Jan. 24, 2019, 8 pgs.

* cited by examiner

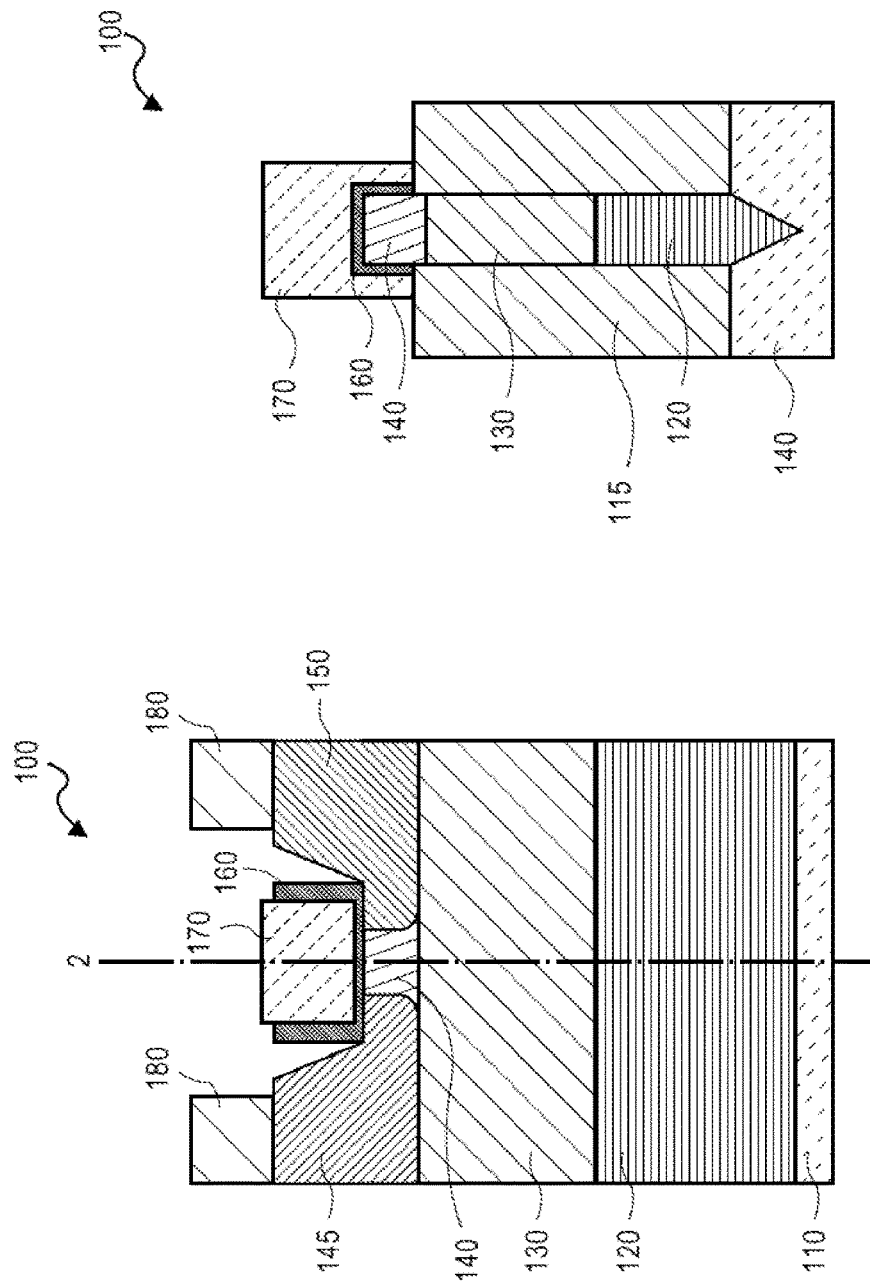

US 10,249,742 B2

OFFSTATE PARASITIC LEAKAGE REDUCTION FOR TUNNELING FIELD EFFECT TRANSISTORS

CROSS-REFERENCE TO RELATED APPLICATION

This patent application is a U.S. National Phase Application under 35 U.S.C. § 371 of International Application No. PCT/US2015/038192, filed Jun. 27, 2015, entitled "OFF-STATE PARASITIC LEAKAGE REDUCTION FOR TUNNELING FIELD EFFECT TRANSISTORS," which designates the United States of America, the entire disclosure of which is hereby incorporated by reference in its entirety and for all purposes.

BACKGROUND

Field

Integrated circuit devices.

Description of Related Art

Tunneling field effect transistors are targeted for ultra low offstate devices. It is therefore important to reduce parasitic leakage. Sources of leakage include leakage from source or drain to body junctions. Another source of leakage may be due to film defects when implementing lattice mismatch materials such as group III-V compound materials, germanium (Ge), silicon germanium (SiGe), germanium tin (GeSn), etc. on silicon. A further source of leakage can occur due to poor surface passivation of these non-silicon materials with other films such as oxides and nitrides that are used, for example, in gate stacks or device isolation.

BRIEF DESCRIPTION OF THE DRAWINGS

FIG. 1 shows a cross-sectional side view of a portion of a tunneling field effect transistor (TFET) device.

FIG. 2 shows the structure of FIG. 1 through line 2-2'.

DETAILED DESCRIPTION

Figure 4:
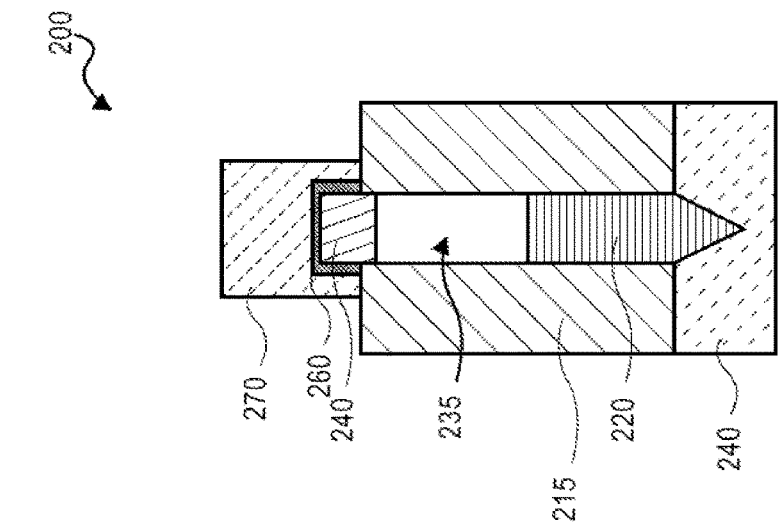
FIG. 4 shows the device of FIG. 3 through line 4-4'.

Techniques to minimize sub-channel parasitic leakage in transistor devices are described. In one embodiment, sub-channel parasitic leakage is reduced over current transistor design by incorporation of a sacrificial sub-fin layer in a multi-gate device and/or the use of large bandgap materials below a channel and/or junction regions (source and drain regions) of a device.

FIG. 1 shows a cross-sectional side view of an embodiment of a tunneling field effect transistor (TFET) device. FIG. 2 shows the structure of FIG. 1 through line 2-2'. Referring to FIG. 1 and FIG. 2, device 100 includes substrate 110 that is, for example, a single crystal silicon substrate. Disposed on substrate 110, in this embodiment, is buffer layer 120. Buffer layer 120 contains, for example, a material that has a larger lattice than a material of the substrate (e.g., silicon substrate 110). One suitable material in buffer layer is germanium. To reduce a threading dislocation density, a material such as germanium may be graded in buffer layer 120 to gradually increase a germanium composition in an epitaxially grown silicon germanium film such that closer to substrate 110, the germanium concentration is less and increases away from the substrate.

In the embodiment in FIG. 1 and FIG. 2, disposed on buffer layer 120 is blocking layer 130. In one embodiment, blocking layer 130 is a blocking material of a wide bandgap material (e.g., a material having a bandgap on the order of at least three electron volts (eV)) that has a lattice structure similar to a lattice of buffer layer 120 at the interface. For a buffer layer of primarily germanium at the interface (buffer layer 120), a suitable wide bandgap material is semi-insulating gallium arsenide (GaAs).

As illustrated in FIG. 1, disposed on blocking layer 130 is junction region 145 and junction region 150. In one embodiment, junction region 145 is a source region of a TFET (e.g., an $n^+$ source) and junction region 150 is a drain region (e.g., $p^+$ drain). Disposed between junction regions 145 and 150 is channel 140 of an intrinsic semiconductor material such as germanium. In one embodiment, a material for blocking layer 130 is a material having a suitable band offset to a material of channel 140. An example of a suitable band offset is 0.5 eV or greater delta with respect to a material of a channel under which blocking layer 130 is positioned. For example, for a germanium PMOS device, GaAs is a suitable material because it has a valence band offset of 0.75 eV from the germanium valence band. Overlying channel region 140 is gate dielectric layer 160 of, for example, a silicon dioxide or a dielectric material having a dielectric constant greater than silicon dioxide (a high k material). Disposed on gate dielectric 160 is gate electrode 170 of, for example, a metal material (e.g., tungsten, tantalum). FIG. 1 also shows metal contact 180 to junction region 145 and metal contact 185 to junction region 150.

As illustrated in FIG. 1, blocking layer 130 is positioned under junction region 145 and junction region 150. Representatively, blocking layer 130 is directly beneath the junction region (e.g., directly in contact with the junction region at the interface). Blocking layer 130 of a wide bandgap is semi-insulating material such as gallium arsenide will reduce the parasitic of the TFET and force current flow from junction region 145 to junction region 150 (source to drain) to be controlled by the gate electrode and thus reduce lower off-state leakage.

Figure 3:
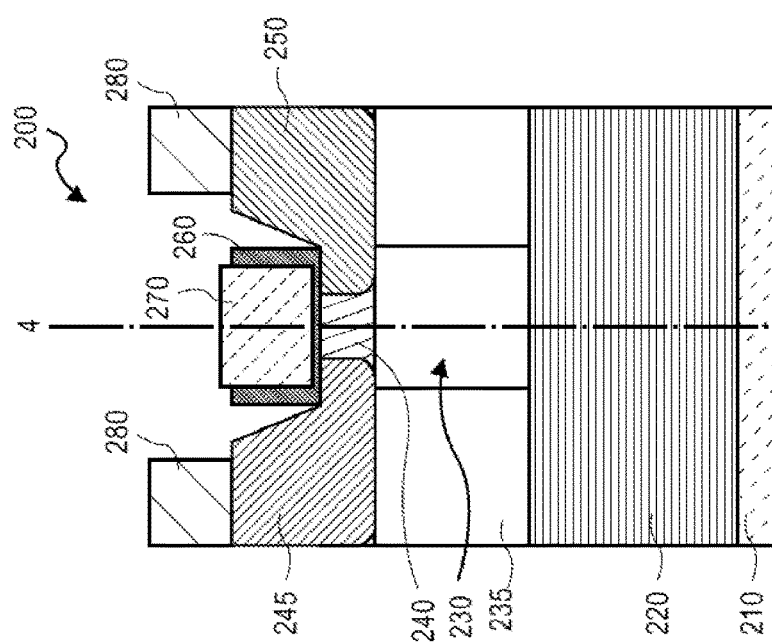
FIG. 3 shows a cross-section of another embodiment of a TFET device.

FIG. 3 shows a cross-section of another embodiment of a TFET device. FIG. 4 shows the device of FIG. 3 through line 4-4'. Referring to FIG. 3 and FIG. 4, the device includes substrate 210 of a semiconductor material such as single crystal silicon. Disposed on substrate 210 is buffer layer 220 including a concentration of a semiconductor material having a lattice larger than a lattice of substrate 210. In one embodiment, buffer layer 220 is a silicon germanium that includes a graded concentration of germanium similar to that describe with reference to the buffer layer of the embodiment described with reference to FIG. 1 and FIG. 2. Disposed on buffer layer 220 is sacrificial layer 230. As illustrated, disposed through a portion of sacrificial layer (a portion beneath a channel region of a device (channel region 240)) is blocking material 235. In this embodiment, blocking material 235 is air or a void. As will be described in more detail layer, in one embodiment, blocking material 235 is formed by removing a portion of sacrificial layer 230 that is beneath a channel region of a device. In such instance, sacrificial layer 230 is a material selected to have a high etch rate selectivity relative to a material of buffer layer 220. Where buffer layer 220 is a silicon germanium material, suitable materials for sacrificial layer 230 include gallium arsenide (GaAs) or indium phosphide (InP).

Blocking material 235 as described herein thus includes a gas such as air. Disposed on sacrificial layer 230, blocking material 235 is a TFET device including junction region 245 (e.g., an $n^+$ source) and junction region 250 (e.g., a $p^+$ drain). Disposed between junctions regions 245 and 250 is channel region 240 of an intrinsic semiconductor material such as germanium. Disposed on channel 240 is gate dielectric 260 and gate electrode 270. FIG. 3 also shows metal contact 280 to junction region 245 and metal contact 285 to junction region 250.

In the illustrated embodiment, there is a void or absence of solid material below channel region 240 (the void representing blocking material). Channel region 240, in one embodiment, approximates a thin nanowire anchored by junction region 245 and junction region 250 and blocking material 235 beneath will reduce a leakage cap to the substrate and prepare for the junction leakage. Current instead will be controlled by gate electrode 270.

Figure 5:
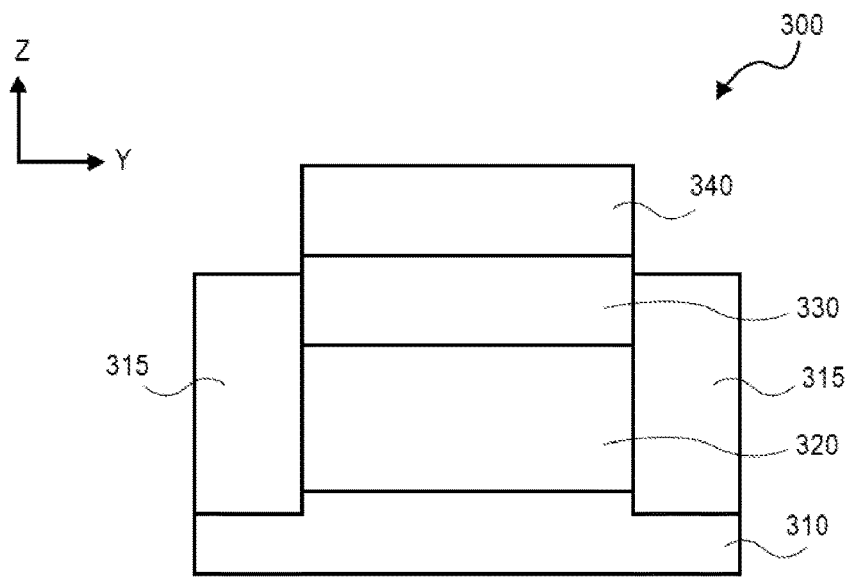
FIG. 5 shows a cross-sectional side view of a semiconductor substrate.

FIGS. 5-8 describe a process for forming the TFET illustrated in FIG. 1 and FIG. 2. FIGS. 5-8 thus describe one embodiment of forming a three-dimensional multi-gate TFET including a blocking layer beneath a channel and junction regions of the device. Referring to FIG. 5, the figure shows a cross-sectional side view of a semiconductor substrate. Substrate 310 includes any material that may serve as a foundation upon which a multi-gate TFET may be constructed. Representatively, substrate 310 is a portion of a larger substrate such as a wafer. In one embodiment, substrate 310 is a semiconductor material such as single crystal silicon. Substrate 310 may be a bulk substrate or, in another embodiment, is a semiconductor on insulator (SOI) structure.

In an embodiment involving non-lattice matched materials, bulk semiconductor substrates allow for implementation of high quality device layers. Disposed on a surface of substrate 310 in FIG. 5 is buffer layer 320. In one embodiment, buffer layer 320 includes a semiconductor material including a concentration of a semiconductor material such as germanium or a group III-V compound material compositionally graded through the layer. In an embodiment where buffer layer 320 includes germanium, a germanium concentration is increased from an interface of the layer with semiconductor substrate 310 toward an apex of the layer as viewed. In this manner, a substrate lattice constant is effectively tuned from silicon at the interface to that of germanium at an apex of layer 320. In one embodiment, buffer layer 320 including a graded concentration of germanium (e.g., silicon germanium buffer layer) may be epitaxially grown on substrate 310.

Overlying or disposed on buffer layer 320 in structure 300 shown in FIG. 5 is blocking layer 330 of a blocking material. In one embodiment, blocking layer 330 includes a material having a wide bandgap. A wide bandgap material, in one embodiment, is a material having a bandgap of at least 3 eV. One suitable material for blocking layer 330 is a semiconductor material having a lattice structure similar to a lattice structure of buffer layer 320 at its interface with blocking layer 330. Where buffer layer 320 includes a high concentration of germanium at its apex, a wide bandgap semiconductor material for blocking layer 330 having a lattice structure similar to germanium is gallium arsenide (GaAs). In one embodiment, a material for blocking layer 330 has a suitable band offset to a material of a channel of a transistor device to be subsequently formed on blocking layer 330. For a germanium PMOS device (a germanium channel material), gallium arsenide is a suitable material because it has a valence band offset of 0.75 eV from the germanium valence band. In one embodiment, a wide bandgap semiconductor material such as gallium arsenide may be epitaxially grown on buffer layer 320. A thickness of blocking layer 330 is representatively on the order of 10 nm to 100 nm.

Overlying or disposed on blocking layer 330 in structure 300 of FIG. 5 is intrinsic layer 340. A representative material for intrinsic layer 340 is a semiconductor material that has a lattice structure similar to a lattice structure of blocking layer 330. One suitable material is germanium. In one embodiment, intrinsic layer 340 of germanium may be epitaxially grown.

FIG. 5 shows structure 300 after formation shallow trench isolation (STI) region 315 to define a device region in the structure. A suitable material for STI 315 is silicon dioxide. In one embodiment, an opening is etched through blocking layer 330, buffer layer 320 and into substrate 310 around a device structure area. The opening is then filled with dielectric material to define STI region. FIG. 3 illustrates structure 300 after portions of STI region 315 has been removed by, for example, an etch process to define a fin of intrinsic layer 340. A representative height of the exposed fin is representatively on the order of 500 angstroms (Å).

Figure 6:
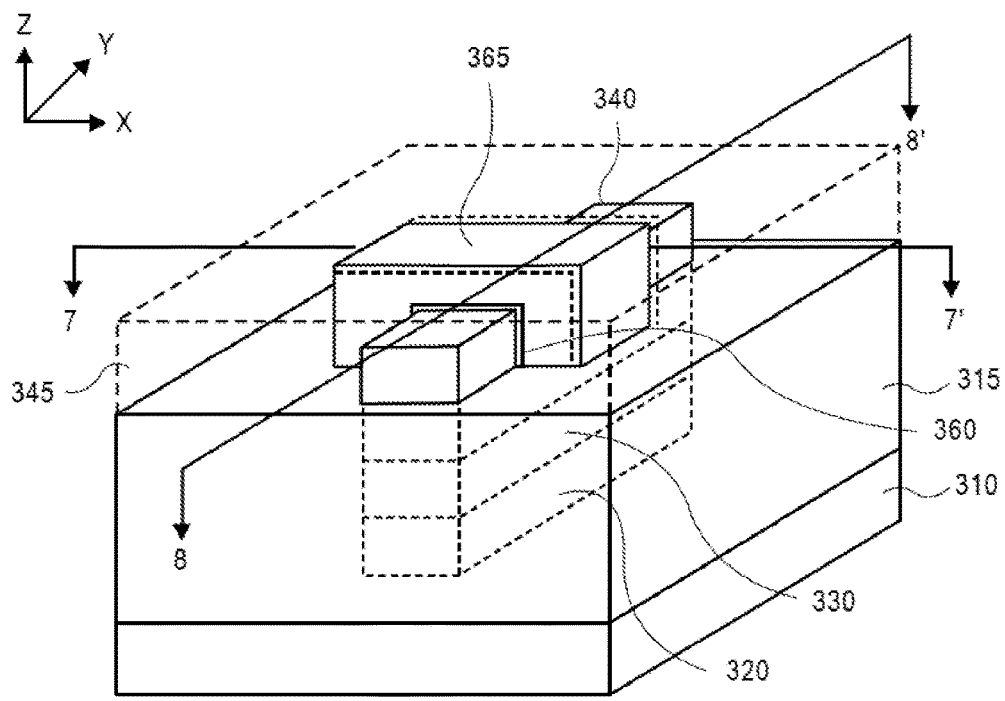
FIG. 6 shows a top side perspective view of the structure of FIG. 5 following the formation of a sacrificial gate stack on a fin portion of an intrinsic layer.

FIG. 6 shows a top side perspective view of the structure of FIG. 5 following the formation of a sacrificial or dummy gate stack on fin portion of intrinsic layer 340 extending above STI region 315. In one embodiment, a gate stack includes gate dielectric layer 360 of, for example, silicon dioxide or a high k dielectric material. Disposed on gate dielectric layer 360, in one embodiment, is dummy gate 365 of, for example, polysilicon deposited by, for example, a chemical vapor deposition method. In one embodiment, to form the gate stack, a mask material is introduced over the structure and patterned to have an opening for the gate stack. The gate stack is introduced. The gate stack may include a spacer dielectric layer on opposite sides thereof. FIG. 6 shows dielectric layer 345 adjacent the sidewalls of the gate stack and on the fin portion of intrinsic layer 340.

Figure 7:
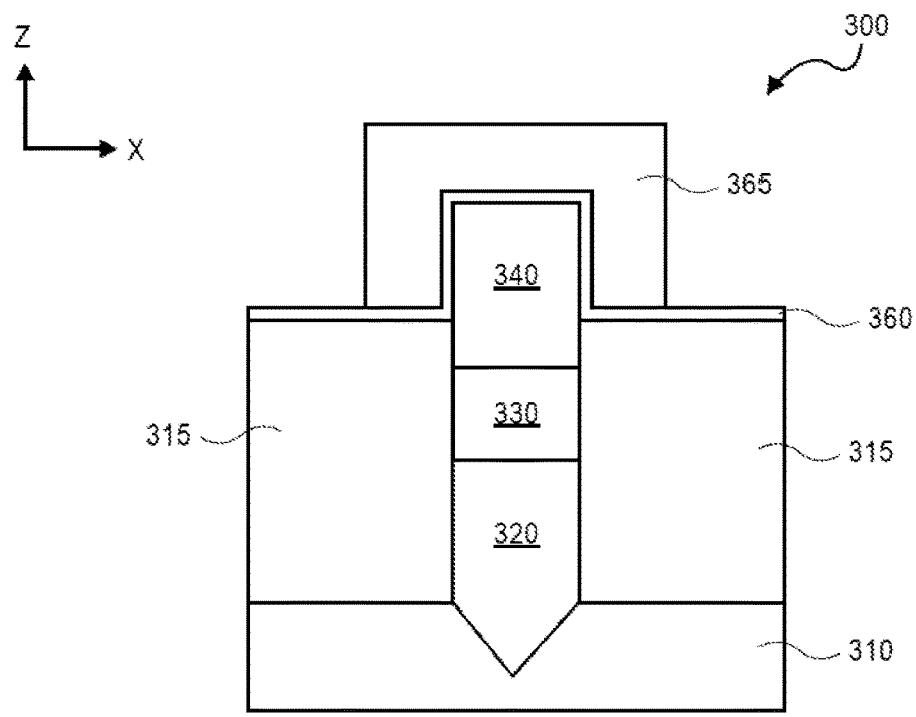
FIG. 7 shows the structure of FIG. 6 through line 7-7' following a removal of the dielectric layer showing the gate stack of a gate dielectric and a dummy gate on the fin defined by the intrinsic layer.
Figure 8:
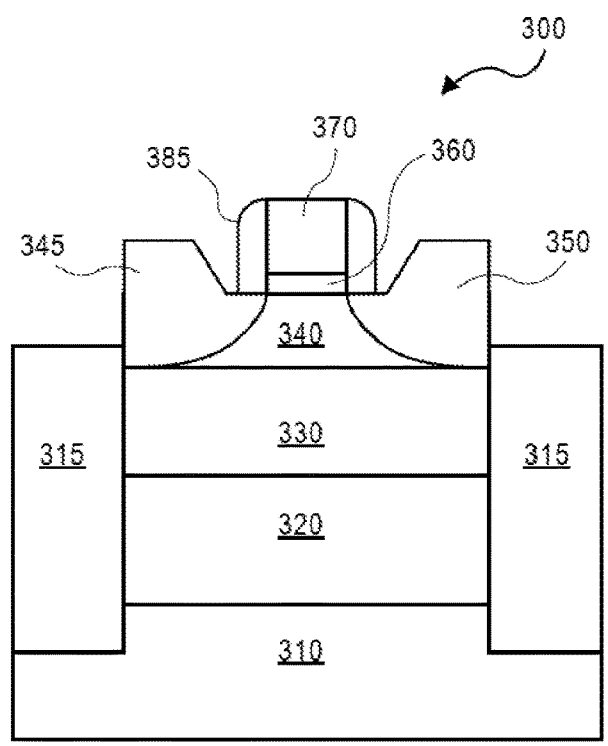
FIG. 8 shows a view of FIG. 6 through line 8-8' illustrating a formation of junction regions in the fin and a replacement of the dummy gate with a gate electrode.

FIG. 7 shows the structure of FIG. 6 through line 7-7' following a removal of dielectric layer 345 showing the gate stack of gate dielectric 360 and dummy gate 365 on the fin defined by intrinsic layer 340. FIG. 8 shows a view of FIG. 6 through line 8-8' illustrating a formation of junction regions in the fin and a replacement of the dummy gate with a gate electrode. Representatively, to form junction regions 345 and 350, the junction regions are exposed in dielectric layer 345. Junction regions 345 and 350 may be formed by removing portions of the fin material and introducing source and drain material such as silicon germanium, pure germanium, and germanium tin to define a source ($n^+$ source) and drain (p+ source), respectively for a TFET. Following formation of junction regions 345 and 350, sacrificial gate 365 is removed and replaced with a gate electrode such as a metal gate electrode. Representative materials for a metal gate electrode include tungsten, tantalum, titanium or a nitride, a metal allow or another material. Following formation of gate electrode 370, contacts may be made to the junction regions to form the device shown in FIG. 1.

Figure 9:
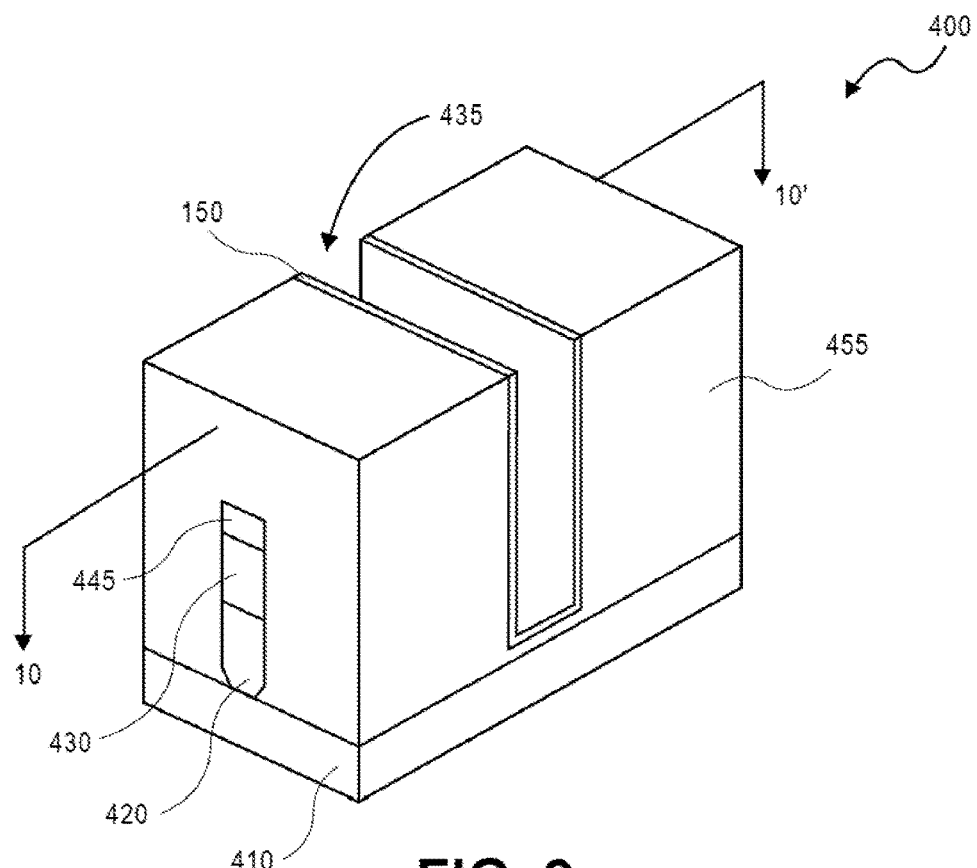
FIG. 9 shows a top perspective view of a portion of a substrate during a formation of another embodiment of a TFET device.
Figure 10:
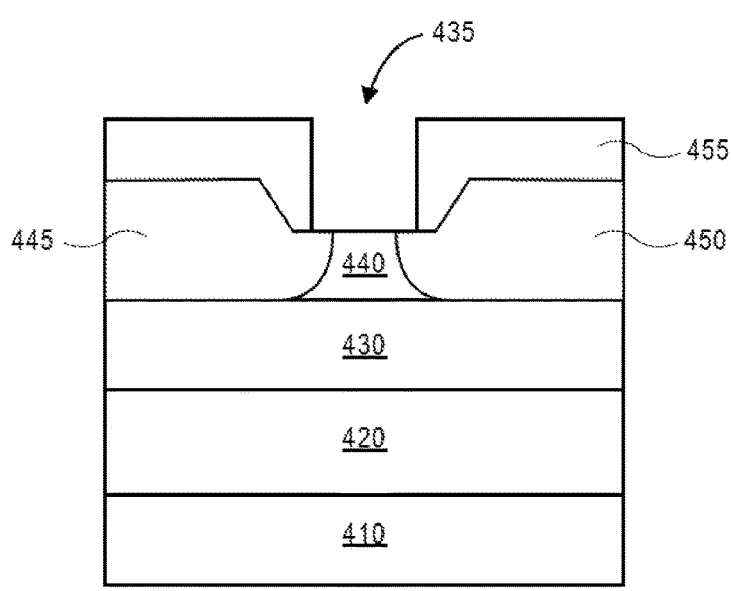
FIG. 10 shows the structure of FIG. 9 through line 10-10'.

FIG. 9 shows a top perspective view of a portion of a semiconductor substrate during the formation of another embodiment of a TFET device. FIG. 10 shows the structure of FIG. 9 through line 10-10'. In one embodiment, the TFET device to be formed will be similar to the one described above with reference to FIG. 3 and FIG. 4. Structure 400 includes device substrate 410 of, for example, a semiconductor material such as single crystal silicon. Disposed on a surface of semiconductor substrate 410 is buffer layer 420. In one embodiment, buffer layer 420 includes a concentration of a semiconductor material having a larger lattice than a lattice of substrate 410. Representatively, a suitable material for buffer layer 420 is epitaxially grown graded silicon germanium. Overlying buffer layer 420 is sacrificial layer 430. In one embodiment, sacrificial layer 430 is a material selected to have a high etch rate selectivity relative to a material of buffer layer 420. Where buffer layer 420 is a silicon germanium material, suitable materials include gallium arsenide or indium phosphide (InP). In one embodiment, a material for sacrificial layer 430 is a material having a lattice structure similar to that a lattice desired of intrinsic 440. For a intrinsic layer material of a group III-V compound semiconductor material such as indium gallium arsenide (InAlAs), a suitable material for sacrificial layer 440 includes gallium arsenide, indium phosphide or indium aluminum arsenide.

Disposed on intrinsic layer 440 of, for example, germanium or group III-V compound semiconductor material that is introduced by an epitaxial process. Disposed on or in intrinsic layer 440 is junction region 445 and junction region 450 (e.g., source and drain region). Source and drain region in such junction regions may be formed as described above with reference to FIGS. 5-8. Disposed on junction regions, in this embodiment, is dielectric layer 455 of, for example, silicon dioxide or a high k dielectric. FIGS. 9-10 shows opening 435 following a removal of a sacrificial gate structure and gate dielectric. With the removal of the sacrificial gate electrode and gate dielectric, sacrificial layer 430 is selectively removed relative to intrinsic layer 440 and buffer layer 420. One way sacrificial layer 430 is removed by a selective etch process. In one embodiment, an etch proceeds to remove all of sacrificial layer 430. In another embodiment, less than all of the sacrificial layer 430 is removed. FIG. 3 and FIG. 4 described above illustrate an embodiment of a final device structure wherein a sacrificial layer has been removed leaving a blocking material (air) between the junction regions and the buffer layer.

Figure 11:
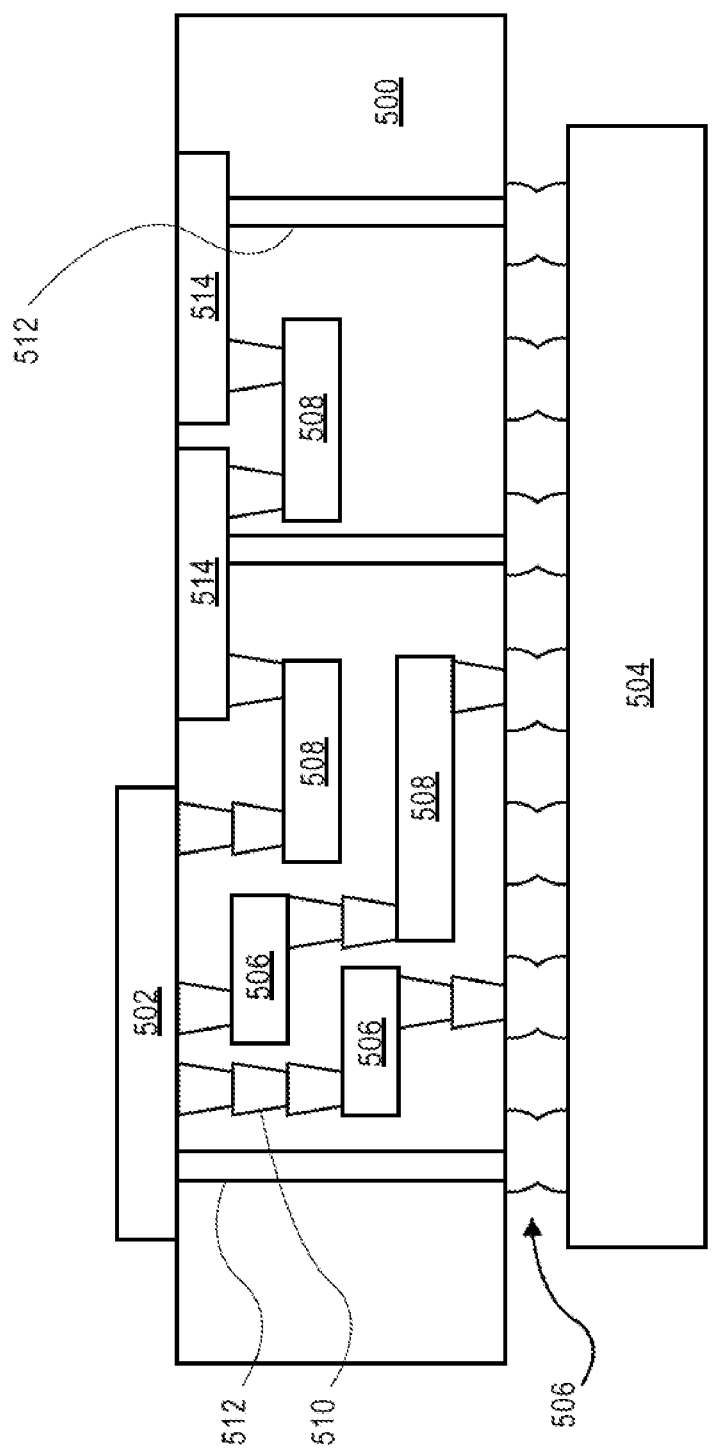
FIG. 11 is an interposer implementing one or more embodiments.

FIG. 11 illustrates interposer 500 that includes one or more embodiments. Interposer 500 is an intervening substrate used to bridge a first substrate 502 to second substrate 504. First substrate 502 may be, for instance, an integrated circuit die. Second substrate 504 may be, for instance, a memory module, a computer motherboard, or another integrated circuit die. Generally, the purpose of interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of interposer 500. In other embodiments, the first and second substrates 502/504 are attached to the same side of interposer 500. In further embodiments, three or more substrates are interconnected by way of interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 500.

In accordance with embodiments, apparatuses or processes disclosed herein may be used in the fabrication of interposer 500.

Figure 12:
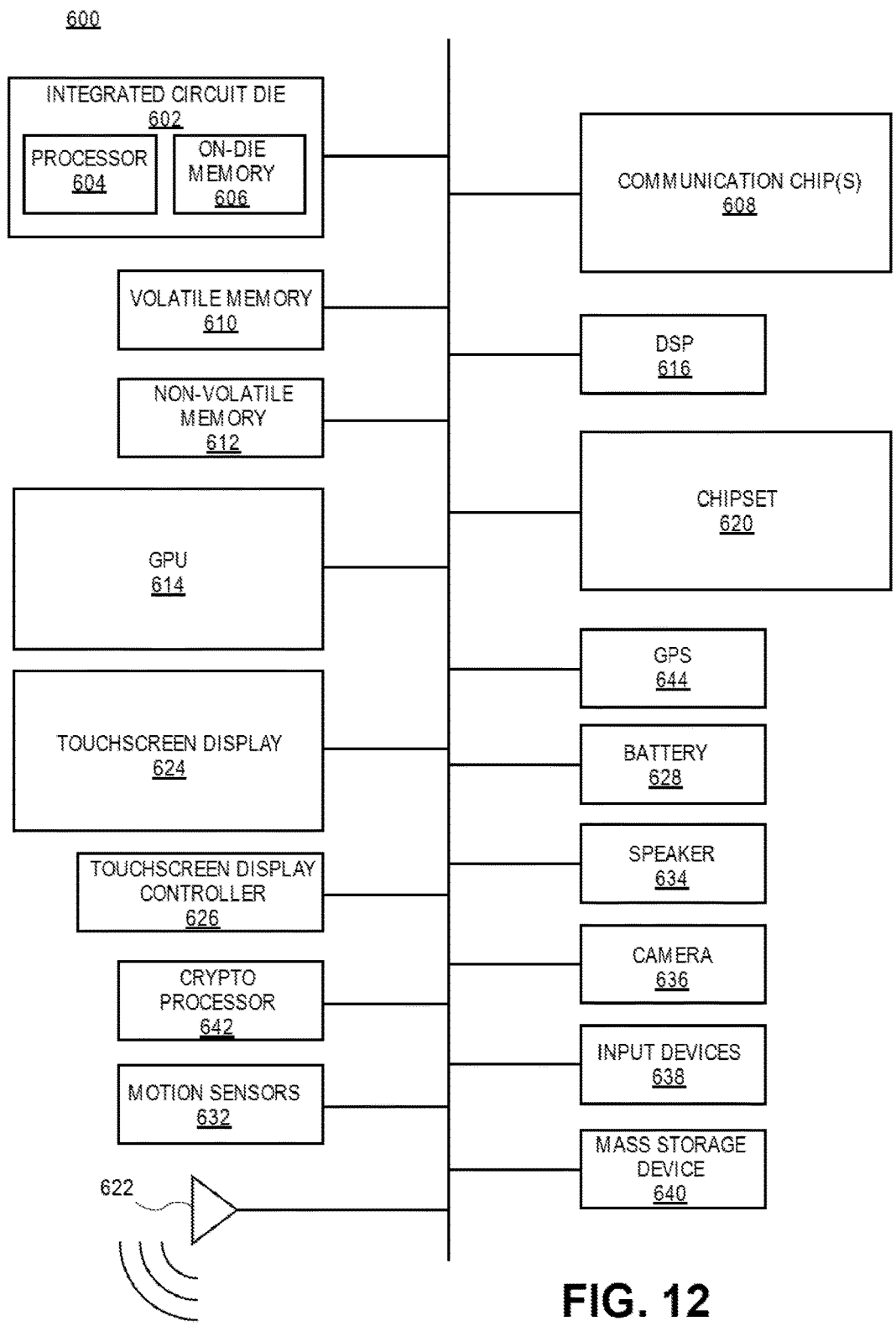
FIG. 12 illustrates an embodiment of a computing device.

FIG. 12 illustrates a computing device 600 in accordance with one embodiment. The computing device 600 may include a number of components. In one embodiment, these components are attached to one or more motherboards. In an alternate embodiment, these components are fabricated onto a single system-on-a-chip (SoC) die rather than a motherboard. The components in the computing device 600 include, but are not limited to, an integrated circuit die 602 and at least one communication chip 608. In some implementations the communication chip 608 is fabricated as part of the integrated circuit die 602. The integrated circuit die 602 may include a CPU 604 as well as on-die memory 606, often used as cache memory, that can be provided by technologies such as embedded DRAM (eDRAM) or spin-transfer torque memory (STTM or STTM-RAM).

Computing device 600 may include other components that may or may not be physically and electrically coupled to the motherboard or fabricated within an SoC die. These other components include, but are not limited to, volatile memory 610 (e.g., DRAM), non-volatile memory 612 (e.g., ROM or flash memory), a graphics processing unit 614 (GPU), a digital signal processor 616, a crypto processor 642 (a specialized processor that executes cryptographic algorithms within hardware), a chipset 620, an antenna 622, a display or a touchscreen display 624, a touchscreen controller 626, a battery 628 or other power source, a power amplifier (not shown), a global positioning system (GPS) device 644, a compass 630, a motion coprocessor or sensors 632 (that may include an accelerometer, a gyroscope, and a compass), a speaker 634, a camera 636, user input devices 638 (such as a keyboard, mouse, stylus, and touchpad), and a mass storage device 640 (such as hard disk drive, compact disk (CD), digital versatile disk (DVD), and so forth).

The communications chip 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 608. For instance, a first communication chip 608 may be dedicated to shorter range wireless communications such as Wi-Fi and Bluetooth and a second communication chip 608 may be dedicated to longer range wireless communications such as GPS, EDGE, GPRS, CDMA, WiMAX, LTE, Ev-DO, and others.

The processor 604 of the computing device 600 includes one or more devices, such as transistors, that are formed in accordance with embodiments described above. The term "processor" may refer to any device or portion of a device that processes electronic data from registers and/or memory to transform that electronic data into other electronic data that may be stored in registers and/or memory.

The communication chip 608 may also include one or more devices, such as transistors, that are formed in accordance with embodiments.

In further embodiments, another component housed within the computing device 600 may contain one or more devices, such as transistors, that are formed in accordance with implementations.

In various embodiments, the computing device 600 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

EXAMPLES

The following examples pertain to embodiments:

Example 1 is a method including forming a non-planar conducting channel of a device between junction regions on a substrate, the substrate including a blocking material beneath the channel, the blocking material including a property to inhibit carrier leakage; and forming a gate stack on the channel, the gate stack including a dielectric material and a gate electrode.

In Example 2, the blocking material of Example 1 includes a wide band gap material.

In Example 3, the wide band gap material of Example 2 includes a group III-V compound material.

In Example 4, the block material of Example 1 includes a band offset to a material of the channel that is 0.5 electron-volts or greater.

In Example 5, the substrate of Examples 1-4 includes a first semiconductor material, and a buffer material on the first semiconductor material, the buffer material including a first lattice structure adjacent the first semiconductor material and a different second lattice structure on a side opposite the first semiconductor material and a material of the channel includes a lattice structure similar to the second lattice structure and the blocking material includes a lattice structure similar to a lattice structure of a material of the channel.

In Example 6, the blocking material of Example 5 is disposed between the buffer material and the channel of the device.

In Example 7, prior to forming the conducting channel, the method of Example 4 includes forming the blocking material on the buffer material and forming the channel includes forming the channel on the blocking material.

In Example 8, the first semiconductor material of Example 4 includes silicon and the buffer material includes graded silicon germanium.

In Example 9, the blocking material of any of Examples 1-8 includes an air gap and after forming the channel, the method includes removing a portion of the substrate beneath the channel.

Example 10 is a method including forming a buffer material on a semiconductor substrate, the buffer material including a semiconductor material including a different lattice structure than the substrate; forming a blocking material on the buffer material, the blocking material including a property to inhibit carrier leakage; and forming a transistor device on the substrate.

In Example 11, forming a transistor device of Example 10 includes forming the transistor device on the blocking material.

In Example 12, the blocking material of Example 11 includes a wide band gap material.

In Example 13, the wide band gap material of Example 12 includes a group III-V compound material.

In Example 14, the substrate of Example 12 includes a first semiconductor material, and a buffer material on the first semiconductor material, the buffer material including a first lattice structure adjacent the first semiconductor material and a different second lattice structure on a side opposite the first semiconductor material and a material of a channel of the transistor device includes a lattice structure similar to the second lattice structure and the blocking material includes a lattice structure similar to a lattice structure of a material of a channel of the transistor device.

In Example 15, the blocking material of Example 14 is disposed between the buffer material and the channel of the transistor device.

In Example 16, prior to forming the conducting channel, the method of Example 14 includes forming the blocking material on the buffer material and forming the channel includes forming the channel on the blocking material.

In Example 17, the blocking material of Example 10 includes a band offset to a material of a channel of a transistor device that is 0.5 electron-volts or greater.

In Example 18, the blocking material of Example 10 includes an air gap and forming a transistor device precedes the forming of the barrier material, wherein prior to forming the barrier material the method includes forming a sacrificial material on the buffer material and forming the barrier material includes removing a portion of the sacrificial material beneath the channel.

In Example 19, the sacrificial material of Example 18 includes an etch selectivity relative to a material of a channel of the transistor device.

Example 20 is an apparatus including a non-planar multi-gate device on a substrate including a transistor device comprising a channel disposed on a substrate including a blocking material beneath the channel, the blocking material including a property to inhibit carrier leakage.

In Example 21, the substrate of Example 20 includes a substrate, the apparatus further including a buffer material on the semiconductor substrate, the buffer material including a semiconductor material including a different lattice structure than a lattice structure of a material of the substrate, wherein the blocking material is disposed between the transistor device and the buffer material.

In Example 22, the conducting portion of Example 19 includes a first conducting portion and a second conducting portion and the oxidized portion of the channel is disposed between the first conducting portion and the conducting portion of the channel.

In Example 23, the blocking material of Example 20 a wide band gap material or an air gap.

In Example 24, the blocking material of Example 20 includes a lattice structure similar to a lattice structure of a material of the channel.

In Example 25, the blocking material of Example 20 includes an air gap.

In Example 26, the block material of Example 20 includes a band offset to a material of the channel that is 0.5 electron-volts or greater.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
forming a non-planar conducting channel of a device between junction regions on a substrate, the substrate comprising a blocking material beneath the channel, the blocking material comprising a property to inhibit carrier leakage, wherein the blocking material comprises an air gap and after forming the channel, the method comprises removing a portion of the substrate beneath the channel; and
forming a gate stack on the channel, the gate stack comprising a dielectric material and a gate electrode.

2. The method of claim 1, wherein the blocking material further comprises a wide band gap material.

3. The method of claim 2, wherein the wide band gap material comprises a group III-V compound material.

4. The method of claim 2, wherein the substrate comprises a first semiconductor material, and a buffer material on the first semiconductor material, the buffer material comprising a first lattice structure adjacent the first semiconductor material and a different second lattice structure on a side opposite the first semiconductor material and a material of the channel comprises a lattice structure similar to the second lattice structure.

5. The method of claim 4, wherein the wide band gap material of the blocking material comprises a lattice structure similar to a lattice structure of a material of the channel.

6. The method of claim 5, wherein the blocking material is disposed between the buffer material and the channel of the device.

7. The method of claim 4, wherein prior to forming the conducting channel, the method comprises forming the blocking material on the buffer material and forming the channel comprises forming the channel on the blocking material.

8. The method of claim 4, wherein the first semiconductor material comprises silicon and the buffer material comprises graded silicon germanium.

9. A method comprising:
forming a buffer material on a semiconductor substrate, the buffer material comprising a semiconductor material comprising a different lattice structure than the substrate;
forming a blocking material on the buffer material, the blocking material comprising a property to inhibit carrier leakage; and
forming a transistor device on the substrate, wherein the blocking material comprises an air gap and forming a transistor device precedes the forming of a barrier material, wherein prior to forming the barrier material the method comprises forming a sacrificial material on the buffer material and forming the barrier material comprises removing a portion of the sacrificial material beneath the channel.

10. The method of claim 9, wherein forming a transistor device comprises forming the transistor device on the blocking material.

11. The method of claim 10, wherein the blocking material further comprises a wide band gap material.

12. The method of claim 11, wherein the wide band gap material comprises a group compound material.

13. The method of claim 11, wherein the substrate comprises a first semiconductor material, and a buffer material on the first semiconductor material, the buffer material comprising a first lattice structure adjacent the first semiconductor material and a different second lattice structure on a side opposite the first semiconductor material and a material of a channel of the transistor device comprises a lattice structure similar to the second lattice structure.

14. The method of claim 13, wherein the wide band gap material of the blocking material comprises a lattice structure similar to a lattice structure of a material of the channel.

15. The method of claim 14, wherein the blocking material is disposed between the buffer material and the channel of the transistor device.

16. The method of claim 13, wherein prior to forming the conducting channel, the method comprises forming the blocking material on the buffer material and forming the channel comprises forming the channel on the blocking material.

17. The method of claim 9, wherein the sacrificial material comprises an etch selectivity relative to a material of a channel of the transistor device.

18. An apparatus comprising:
a non-planar multi-gate device on a substrate comprising a transistor device comprising a channel disposed on a substrate comprising a blocking material beneath the channel, the blocking material comprising a property to inhibit carrier leakage, wherein the blocking material comprises an air gap.

19. The apparatus of claim 18, wherein the substrate comprises a substrate, the apparatus further comprising a buffer material on the semiconductor substrate, the buffer material comprising a semiconductor material comprising a different lattice structure than a lattice structure of a material of the substrate, wherein the blocking material is disposed between the transistor device and the buffer material.

20. The apparatus of claim 18, wherein a conducting portion of the channel comprises a first conducting portion and a second conducting portion, and an oxidized portion of the channel is disposed between the first conducting portion and the second conducting portion of the channel.

21. The apparatus of claim 18, wherein the blocking material further comprises a wide band gap material.

22. The apparatus of claim 21, wherein the wide band gap materials of the blocking material comprises a lattice structure similar to a lattice structure of a material of the channel.

\* \* \* \* \*